United States Patent
Kohtaka (10) Patent No.: US 7,349,054 B2
(45) Date of Patent: Mar. 25, 2008

(54) METHOD OF MOUNTING FLEXIBLE CIRCUIT BOARDS, AND DISPLAY DEVICE

(75) Inventor: Satoshi Kohtaka, Kumamoto (JP)

(73) Assignee: Advanced Display, Inc.

(*) Notice: Subject to any disclaimer, the term of this patent is extended or adjusted under 35 U.S.C. 154(b) by 131 days.

(21) Appl. No.: 10/292,167

(22) Filed: Nov. 12, 2002

(65) Prior Publication Data
US 2003/0095227 A1 May 22, 2003

(30) Foreign Application Priority Data
Nov. 22, 2001 (JP) .............................. 2001-357693

(51) Int. Cl.
*G02F 1/1345* (2006.01)
*H05K 1/09* (2006.01)
(52) U.S. Cl. ..................... 349/150; 349/152; 174/257
(58) Field of Classification Search ................ 349/149, 349/150–152; 174/257–258
See application file for complete search history.

(56) References Cited

U.S. PATENT DOCUMENTS

| | | | | |
|---|---|---|---|---|
| 4,296,457 A | * | 10/1981 | Hahlganss | ................... 361/785 |
| 5,418,691 A | * | 5/1995 | Tokura | ........................ 361/803 |
| 6,005,652 A | * | 12/1999 | Matsuhira | ................... 349/149 |

FOREIGN PATENT DOCUMENTS

| | | | |
|---|---|---|---|
| JP | 2-69497 | | 5/1990 |
| JP | 5 173166 A | | 7/1993 |
| JP | 7049657 | | 2/1995 |
| JP | 7183634 | | 7/1995 |
| JP | 1117288 | * | 1/1999 |
| JP | 1154873 | * | 2/1999 |
| JP | 3 054 135 | | 4/2000 |

OTHER PUBLICATIONS

Partial English translation of pertinent paragraphs of Hirobe et al./SHARP disclosure (JP patent 3 054 135 granted Apr. 7, 2000).
Patent Abstracts of Japan, pub. No. 2000-227 783, published Aug. 15, 2000, abstracting Hirobe et al./SHARP CORP, disclosure.

* cited by examiner

*Primary Examiner*—Toan Ton (57) ABSTRACT

The present invention is a method of mounting flexible circuit boards including: electrode groups formed on an insulating substrate; terminal groups formed in the vicinity of at least one side of the insulating substrate in such a manner as to be connected to outside at the electrode ends of the electrode groups; and terminals to be connected to the terminal groups; and a plurality of flexible circuit boards equipped with driver circuits inputting signals to the electrode groups via the terminals, wherein the method includes the step of mounting the flexible circuit boards on the insulating substrate in a manner that the flexible circuit boards share overlap regions with adjacent flexible circuit boards.

6 Claims, 11 Drawing Sheets

METHOD OF MOUNTING FLEXIBLE CIRCUIT BOARDS, AND DISPLAY DEVICE

BACKGROUND OF THE INVENTION

The present invention relates to a method of mounting flexible circuit boards on a display device, which contains driver circuits mounted thereon, by using the flexible circuit boards, and more specifically relates to such a method suitable for a liquid crystal display device.

Figure 11:
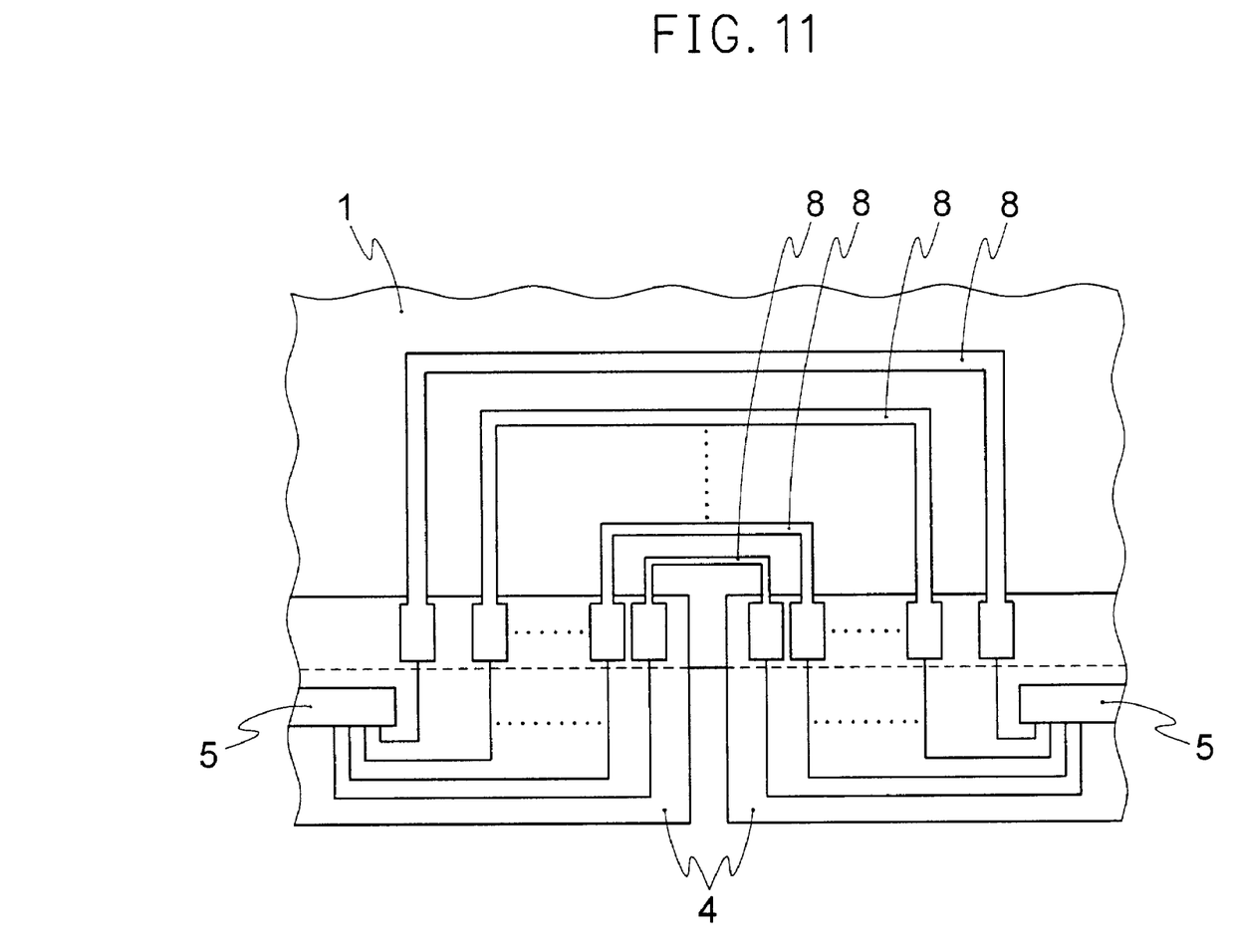
FIG. 11 is a view for explaining the method of mounting flexible circuit boards in the conventional liquid crystal display device.

A method of mounting flexible circuit boards equipped with driver circuits in a conventional display device has been disclosed in Japanese Patent Publication No. 3054135. FIG. 11 is a Figure to explain a method of mounting flexible circuit boards in the conventional art for liquid crystal display device. In the view, reference numeral 1 shows an insulating substrate, reference numeral 4 shows flexible circuit boards, reference numeral 5 shows driver circuits, and reference numeral 8 shows common signal lines.

In FIG. 11 the common signal lines, which are commonly connected to each driver circuit, are connected with the flexible circuit boards 4 having the driver circuits on the insulating substrate 1 via an ACF (Anisotropic Conductive Film). As a result, the structure for providing the common signal lines may become smaller, compared with the conventional structure where the common signal lines are formed on PCBs (Printed Circuit Boards) provided separately, thereby further making the frame area smaller in the display device.

However, the above-mentioned conventional art has the following problems. A problem is that it is necessary to form patterns on the insulating substrate due to connecting the common signal lines 8 via patterns 8. Another problem is that in connecting the common signal lines between two adjacent flexible circuit boards, two times as many terminals as the number of the common signal lines are formed and connected after the terminals of the flexible circuit board side and the terminals of the insulating substrate side are positioned, which makes it difficult to improve connection reliability. Further another problem is that the flexible circuit boards are mounted at substantially the same intervals on the insulating substrate as in each flexible circuit board, which makes it difficult to achieve high density packaging that has been demanded due to the high precision of the display devices in recent years.

SUMMARY OF THE INVENTION

The present invention, which has been contrived in view of the aforementioned problems, has an object to provide a method of mounting flexible circuit boards that enables the flexible circuit boards to be mounted in high density and with high connection reliability and a display device containing such flexible circuit boards.

A first method of mounting flexible circuit boards of the present invention includes: electrode groups formed on an insulating substrate; terminal groups formed in the vicinity of at least one side of the insulating substrate in such a manner as to be connected to outside at the electrode ends of the electrode groups; and terminals to be connected to the terminal groups; and a plurality of flexible circuit boards equipped with driver circuits inputting signals to the electrode groups via the terminals, the method including the step of mounting the flexible circuit boards on the insulating substrate in a manner that the flexible circuit boards share overlap regions with adjacent flexible circuit boards.

A second method of mounting flexible circuit boards of the present invention is characterized in that, in the first method of mounting flexible circuit boards, the step of mounting the flexible circuit boards on the insulating substrate in such a manner that the flexible circuit boards share overlap regions with adjacent flexible circuit boards includes either the step of first mounting odd-numbered flexible circuit boards when counted from one end of the aligned flexible circuit boards, and then mounting even-numbered flexible circuit boards or the step of first mounting even-numbered flexible circuit boards when counted from one end of the aligned flexible circuit boards, and then mounting odd-numbered flexible circuit boards.

A third method of mounting flexible circuit boards of the present invention is characterized in that, in the first or second method of mounting flexible circuit boards, the flexible circuit boards further include driver signal lines which are outputted from the driver circuits and are connected to the electrode groups on the insulating substrate, and common signal lines which are connected between the flexible circuit boards, the method further including the step of connecting the common signal lines between adjacent flexible circuit boards through conductive patterns on the flexible circuit boards.

A fourth method of mounting flexible circuit boards of the present invention is characterized in that, in the third method of mounting flexible circuit boards, the step of mounting the flexible circuit boards on the insulating substrate in a manner that the flexible circuit boards share overlap regions with adjacent flexible circuit boards further includes the step of connecting the common signal lines in regions where adjacent flexible circuit boards overlap with each other and said adjacent flexible circuit boards also overlap with the surface of the insulating substrate that has the electrode groups thereon.

A fifth method of mounting flexible circuit boards of the present invention includes: electrode groups formed on an insulating substrate; terminal groups formed in the vicinity of at least one side of the insulating substrate in such a manner as to be connected to outside at the electrode ends of the electrode groups; and a plurality of flexible circuit boards equipped with driver circuits containing terminals to be connected to the terminal groups and supplying the electrode groups with signals through the terminals and also equipped with common signal lines which are commonly connected to the driver circuits and driver signal lines which are outputted from the driver circuits and are connected to the electrode groups on the insulating substrate, the method including the step of mounting the flexible circuit boards on the insulating substrate in such a manner as to be arranged close to adjacent flexible circuit boards; the step of forming connection terminals in regions of the insulating substrate that overlap with the vicinity of gaps between adjacent flexible circuit boards; and the step of connecting the common signal lines on the flexible circuit boards via the connection terminals.

A first display device of the present invention includes: electrode groups formed on an insulating substrate; terminal groups formed in the vicinity of at least one side of the insulating substrate in such a manner as to be connected to outside at the electrode ends of the electrode groups; a driver circuits inputting the signals to the electrode groups via terminals to be connected to the terminal groups and the terminals; and a plurality of flexible circuit boards mounted on the mounted on insulating substrate, the display device being characterized in that the flexible circuit boards share overlap regions with adjacent flexible circuit boards.

A second display device of the present invention is characterized in that, in the first display device, the overlap regions of adjacent flexible circuit boards are formed by mounting the flexible circuit boards either in such a manner that even-numbered flexible circuit boards when counted from one end of the aligned flexible circuit boards are partly overlaid on odd-numbered flexible circuit boards, or in such a manner that odd-numbered flexible circuit boards when counted from one end of the aligned flexible circuit boards are partly overlaid on even-numbered flexible circuit boards.

A third display device of the present invention is characterized in that, in the first or second display device, the flexible circuit boards further include driver signal lines which are outputted from the driver circuits and are connected to the electrode groups on the insulating substrate and common signal lines which are connected between the flexible circuit boards, and that the common signal lines are connected between adjacent flexible circuit boards through conductive patterns on the flexible patterns.

A fourth display device of the present invention is characterized in that, in the third display device, the common signal lines, which are connected between adjacent flexible circuit boards by the conductive patterns on the flexible circuit boards, are connected in regions which are the overlap regions shared by adjacent flexible circuit boards and which also overlap with the surface of the insulating substrate that has the electrode groups thereon.

A fifth display device of the present invention includes; electrode groups formed on an insulating substrate; terminal groups formed in the vicinity of at least one side of the insulating substrate in such a manner as to be connected to outside at the electrode ends of the electrode groups; and a plurality of flexible circuit boards equipped with driver circuits containing terminals to be connected to the terminal groups and inputting signals to the electrode groups via the terminals and also equipped with common signal lines which are commonly connected between adjacent flexible circuit boards and driver signal lines which are outputted from the driver circuits and are connected to the electrode groups on the insulating substrate, the flexible circuit boards being mounted on the insulating substrate, the display device being characterized in that the flexible circuit boards are mounted on the insulating substrate in such a manner as to be arranged close to adjacent flexible circuit boards, and that the common signal lines on the flexible circuit boards are connected via connection terminals formed in the vicinity of gaps between adjacent flexible circuit boards and on the insulating substrate.

BRIEF DESCRIPTION OF THE DRAWINGS

FIG. 3($a$) is a cross sectional view taken along the line B-B of FIG. 2, FIG. 3($b$) is a cross sectional view taken along the line C-C of FIG. 2, and FIG. 3($c$) is a cross sectional view of the terminal portions of the flexible circuit boards.

FIG. 7($a$) is a cross sectional view taken along the line E-E of FIG. 6, and FIG. 7($b$) is a cross sectional view taken along the line F-F of FIG. 6.

FIG. 9($a$) is a cross sectional view taken along the line G-G of FIG. 8, and FIG. 9($b$) is a cross sectional view taken along the line H-H of FIG. 8.

DETAILED DESCRIPTION

EMBODIMENT 1

Figure 1:
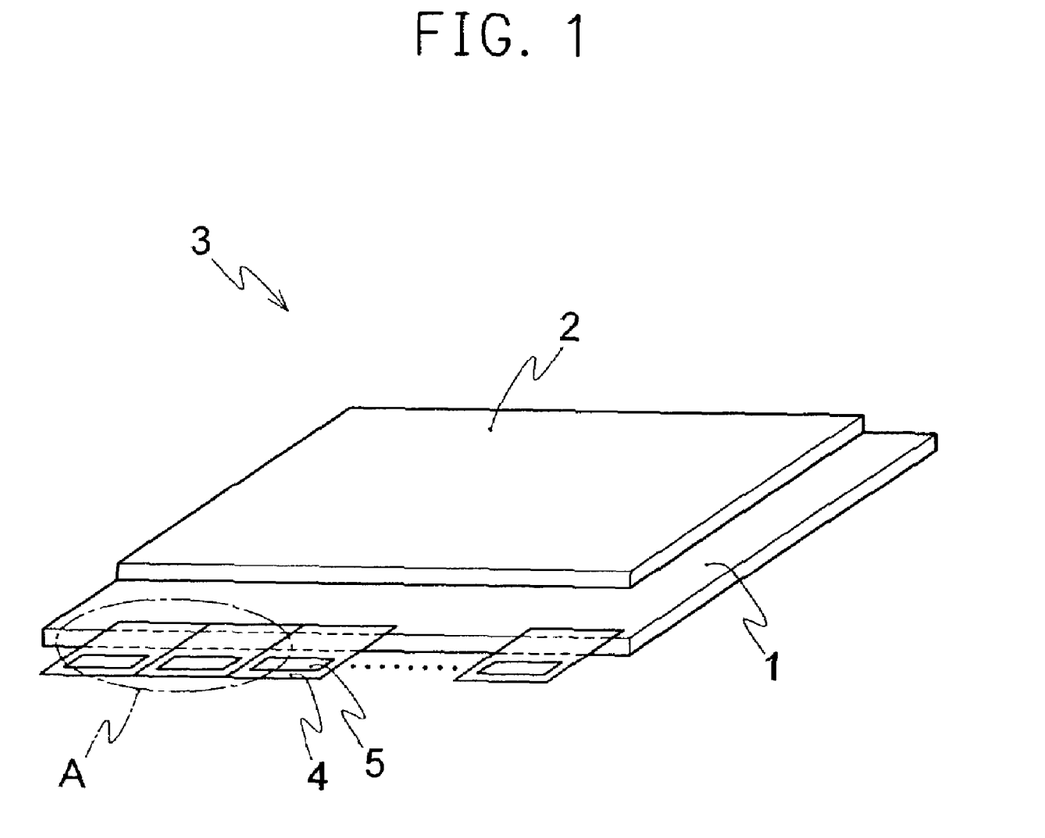
FIG. 1 is a perspective view of the liquid crystal display panel in Embodiment 1 of the present invention.
Figure 2:
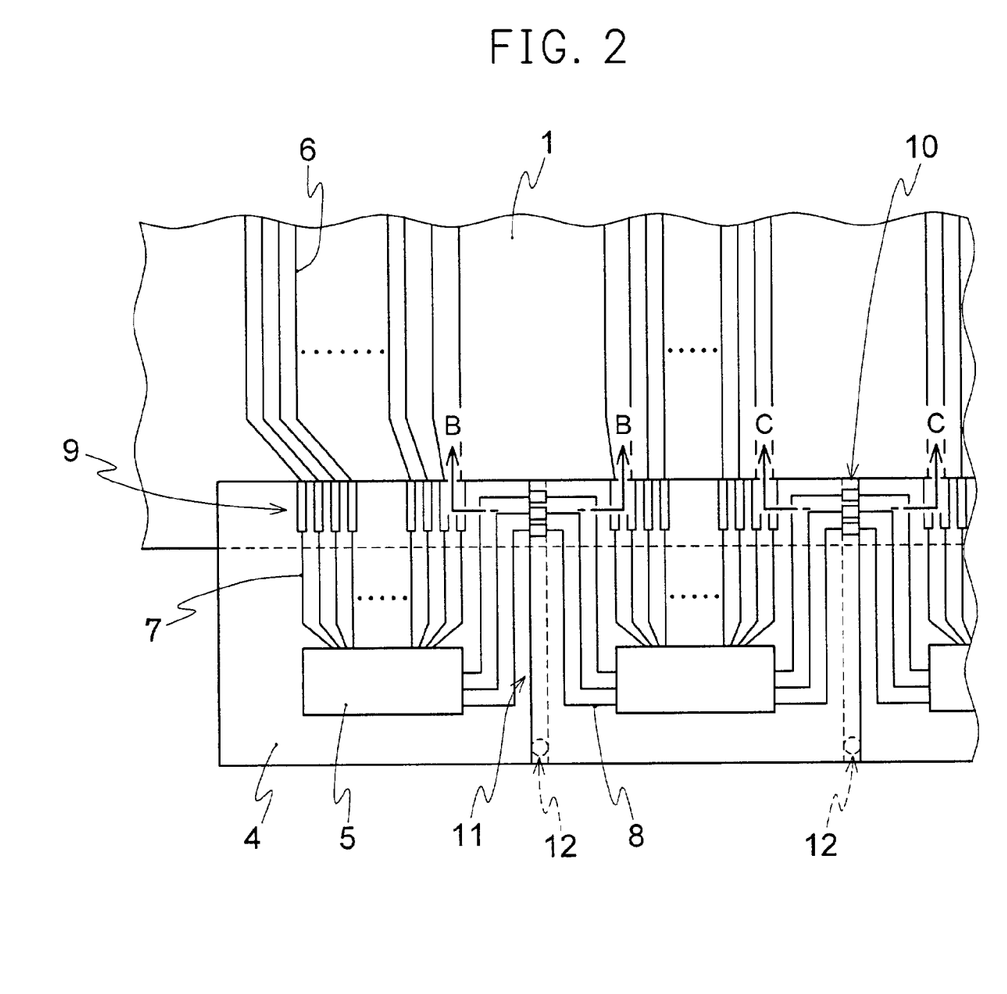
FIG. 2 is a magnified view of mounted portion A of the flexible circuit boards in FIG. 1.
Figure 3A:
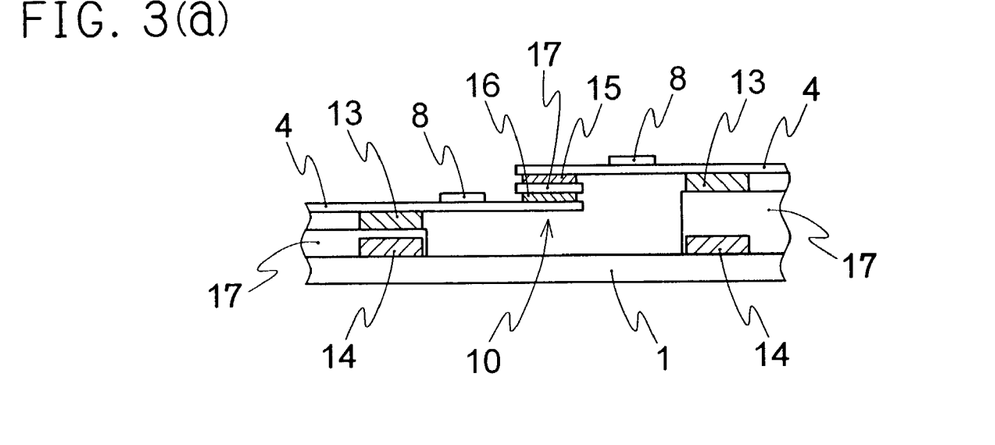
Figure 3B:
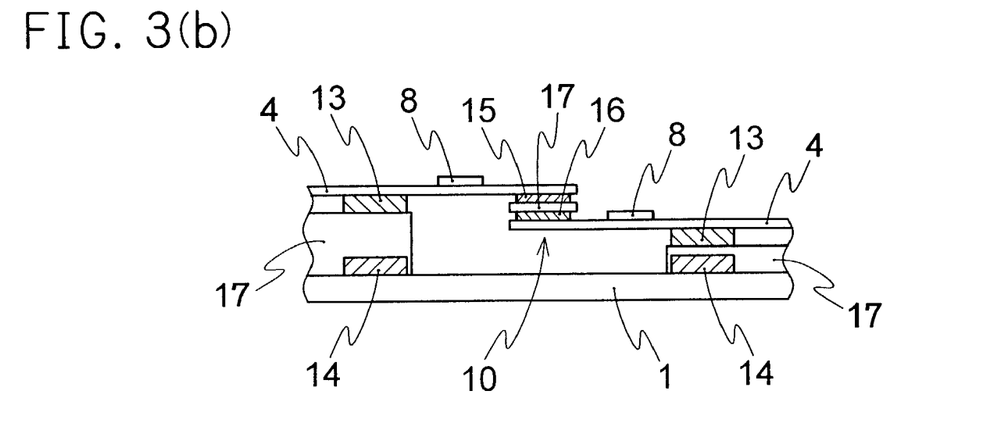
Figure 3C:
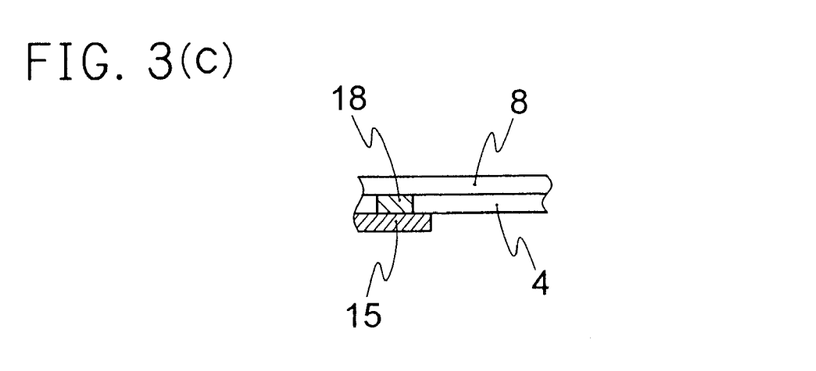

A first embodiment of the present invention will be described as follows based on FIGS. 1 to 3. FIG. 1 is a perspective view of the liquid crystal display panel in the first embodiment of the present invention; FIG. 2 is a an enlarged of mounted portion A of the flexible circuit boards in FIG. 1; FIG. 3($a$) is a cross sectional view taken along the line B-B of FIG. 2; FIG. 3($b$) is a cross sectional view taken along the line C-C of FIG. 2; and FIG. 3($c$) is a cross sectional view of the terminal portion of the flexible circuit boards.

In FIGS. 1 through 3, there are an insulating substrate 1 made of a glass substrate or the like; a counter substrate 2; a liquid crystal display panel 3; flexible circuit boards 4 made of a film or the like; driver circuits 5; a wiring pattern 6 which is electrode groups on the insulating substrate 1; driver signal lines 7 which are outputted from the driver circuits and inputted to the liquid crystal display panel; common signal lines 8 including a start signal and each power supply line or the like, which are commonly connected between the driver circuits; connection regions 9 between the flexible circuit boards and the insulating substrate; connection portion 10 between the common signal lines; overlap regions 11 shared by the adjacent flexible circuit boards; fixing portion 12 between adjacent flexible circuit boards; connection terminals 13 of the signal lines formed on the flexible circuit boards; connection terminals 14 of the signal lines formed on the insulating substrate; connection terminals 15 of the common signal lines formed on the rear side of the flexible circuit boards; connection terminals 16 of the common signal lines formed on the front side of the flexible circuit boards; a conductive material 17; and through holes 18.

As shown in FIG. 1 in order to drive the liquid crystal display panel 3 containing a display material such as liquid crystal between the insulating substrate 1 and the counter substrate 2, the flexible circuit boards 4 having the driver circuits 5 thereon are mounted in the vicinity of at least one peripheral side of the insulating substrate 1.

FIG. 2 is an enlarged view of mounted portion A of the flexible circuit boards 4 mounted on the insulating substrate 1 of the liquid crystal display panel 3 of FIG. 1. As shown in FIG. 2 the flexible circuit boards are mounted in such a manner that they are connected with the electrode terminal portions 14 of the wiring patterns 6 which are the electrode groups formed on the insulating substrate at the connection regions 9 between the flexible circuit boards and the insulating substrate, and that the flexible circuit boards share the overlap regions 11 with adjacent flexible circuit boards. Such mounting of the flexible circuit boards with the overlap regions 11 between adjacent flexible circuit boards achieves high density packaging. In the present embodiment as shown in FIG. 2 the common signal lines are directly connected between adjacent flexible circuit boards in the connection portion 10 of the common signal lines, which are the overlap regions between adjacent flexible circuit board and are also the overlap regions between the flexible circuit boards and the side of the insulating substrate that has the wiring patterns 6 thereon as the electrode groups.

FIGS. 3(a) and 3(b) show cross sectional views taken along the line B-B and the line C-C, respectively, of the connection regions. The connection terminals 14 of the driver signal lines on the insulating substrate, which are formed at the end portions of the wiring patterns 6 as the electrode groups on the insulating substrate, are connected with the connection terminals 13 formed on the flexible circuit boards 4 via the conductive material 17 such as an ACF. In addition, the connection terminals 15 of the common signal lines formed on the rear sides of the flexible circuit boards 4 are connected with the connection terminals 16 of the common signal lines formed on the front sides of the flexible circuit boards via the conductive material 17 such as an ACF at regions which are the overlap regions 11 shared by adjacent flexible circuit boards 4 and are also the overlap regions 10 between the flexible circuit boards 4 and the surface of the insulating substrate on which the wiring patterns 6 are formed as the electrode groups. In this case, the patterns 8 for the common signal lines and the patterns 7 for the driver signal lines on the flexible circuit boards can be formed on either the front side or the rear side of the flexible circuit boards. And when the patterns for the common signal lines 8 are on the side opposite to the connection terminals formed on the flexible circuit boards, as shown in FIG. 3(c), through holes 18 are provided on the terminal regions 15 on the substrate so as to connect the patterns 8 for the common signal lines to the connection terminals 15.

The aforementioned structure achieves high density packaging, and more secured connection because the common signal lines 8 are directly connected between adjacent flexible circuit boards 4 at only one site without a wiring pattern on the insulating substrate 1 or a wiring pattern on the PCB. In addition, in the present embodiment there is the insulating substrate 1 on the rear side of the connection portions 10 between adjacent flexible circuit boards 4. This enables the connection terminals 16, 15 formed on the front and rear sides of the flexible circuit boards to be connected more securely via the conductive material 17 such as an ACF hardened by thermo compression bonding.

When the flexible circuit boards 4 are mounted on the insulating substrate 1, odd-numbered (the first, third, fifth . . . ) flexible circuit boards counted from an end of the aligned flexible circuit boards are first mounted on the insulating substrate 1, and then even-numbered (the second, fourth, sixth . . . ) flexible circuit boards are mounted. Alternatively, even-numbered (the second, fourth, sixth . . . ) flexible circuit boards counted from an end of the aligned flexible circuit boards can be first mounted, and then odd-numbered (the first, third, fifth . . . ) flexible circuit boards can be mounted.

When such mounting is performed, in the case where the odd-numbered flexible circuit boards counted from the left end of the aligned flexible circuit boards shown in FIGS. 3(a) and 3(b) are mounted first and then even-numbered ones are mounted, the connection terminals 15 at the right and left ends of the second flexible circuit board are both arranged on the top surfaces of adjacent flexible circuit boards. Such mounting improves workability in replacing a flexible circuit board having a defective driver circuit or a defective wiring pattern with a good one after being installed as a display device, when compared with the case where flexible circuit boards are mounted in the order in which they are aligned.

There are cases where after being mounted on the insulating substrate 1, the flexible circuit boards 4 are bent to the rear side that is opposite to the side having the electrode groups thereon in order to reduce the frame area of the display device. Workability in the bending operation can be improved by applying an adhesive agent to the fixing portion regions 12 which are between adjacent flexible circuit boards of FIG. 2 in the most appropriate time of the same time as, before, or after the mounting of the flexible circuit boards. The fixing portions 12 are each provided at one site only near the other ends of the overlap regions 11 in the flexible circuit boards 4 that are opposite to the connection regions between the flexible circuit boards and the insulating substrate 1; however, the fixing portions 12 can be provided in several sites at predetermined intervals within the number not to cause inconvenience in the bending operation of the flexible circuit boards.

In the present embodiment, as a method of introducing the common signal lines 8 into the plural flexible circuit boards 4 from outside, it is possible to provide terminals to, e.g. the right-end flexible circuit board of the plural flexible circuit boards in FIG. 1 and other terminals to the positions on the insulating substrate 1 which correspond to the terminals, thereby introducing the common signal lines 8 through these terminals and the patterns on the insulating substrate.

Alternatively, common signal lines 8 that may bypass the driver circuits 5 can be provided between the flexible circuit boards 4 and be connected by using the connection units 10 thereof.

EMBODIMENT 2

Figure 4:
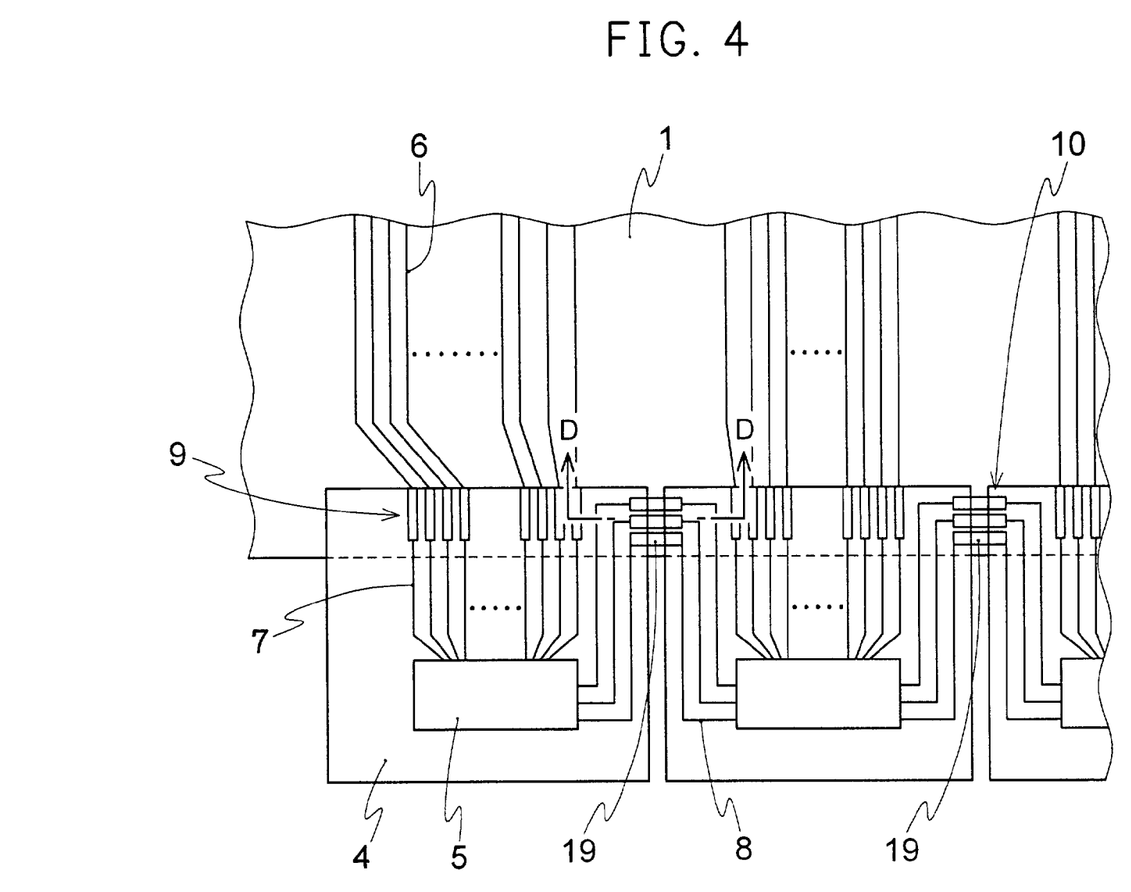
FIG. 4 is a plan view of the mounted portion of the flexible circuit boards in Embodiment 2 of the present invention.
Figure 5:
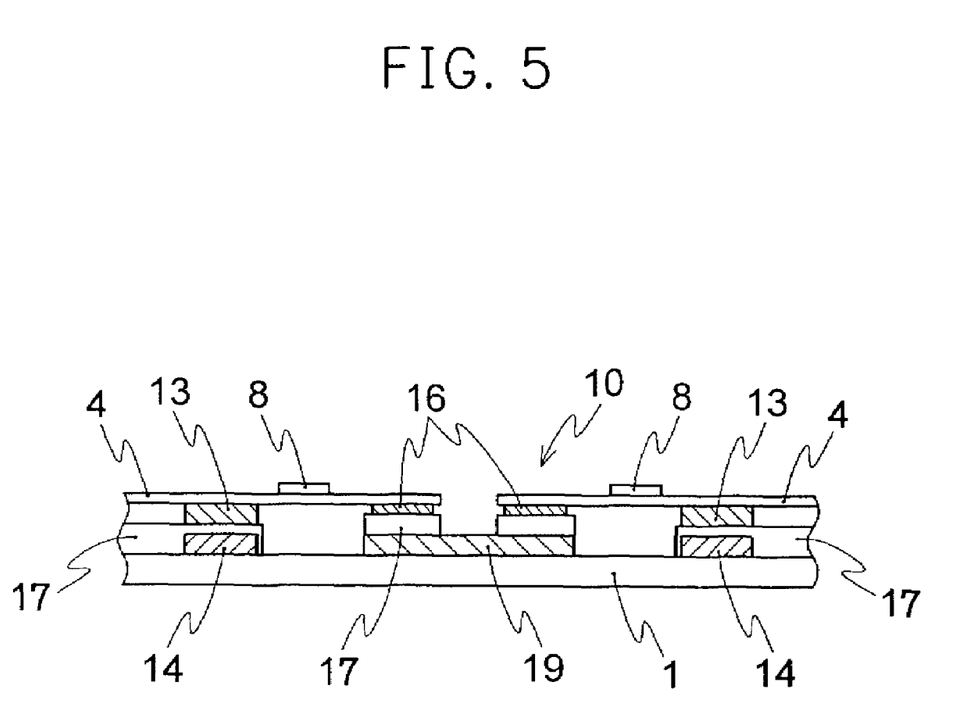
FIG. 5 is a cross sectional view taken along the line D-D in FIG. 4.

A second embodiment of the present invention will be described as follows based on FIGS. 4 and 5. FIG. 4 is a plan view of the mounted portion of the flexible circuit boards 4 in the second embodiment of the present invention, and FIG. 5 is a cross sectional view taken along the line D-D of FIG. 4. In FIGS. 4 and 5, the same components as those in FIGS. 1 to 3 are referred to with the same reference symbols and the following description will be focused on differences between FIGS. 1 to 3 and FIGS. 4 to 5. In FIGS. 4 and 5, there are connection terminals 19 of the common signal lines 8 formed on the insulating substrate 1. The present embodiment differs from the first embodiment in that adjacent flexible circuit boards 4 do not have overlap regions therebetween, and that the insulating substrate 1 has the connection terminals 19 thereon in order to connect the common signal lines 8 between adjacent flexible circuit boards, thereby connecting the driver circuits 5. The connection terminals 19 of the common signal lines 8 formed on the insulating substrate 1 can be formed at the same time as patterning of the wiring patterns 6 on the insulating substrate, and can be laid in the positions corresponding to the connection terminals 16 of the common signal lines formed on the flexible circuit boards.

The aforementioned structure reveals the same effects as in the first embodiment, and causes no inconvenience in the operation to bend the flexible circuit boards to the rear side of the insulating substrate 1, because the flexible circuit boards 4 are mounted at appropriate intervals not to overlap with adjacent flexible circuit boards. By this mounting higher density packaging than in the conventional art is attained. In addition, all the flexible circuit boards can be mounted concurrently.

EMBODIMENT 3

Figure 6:
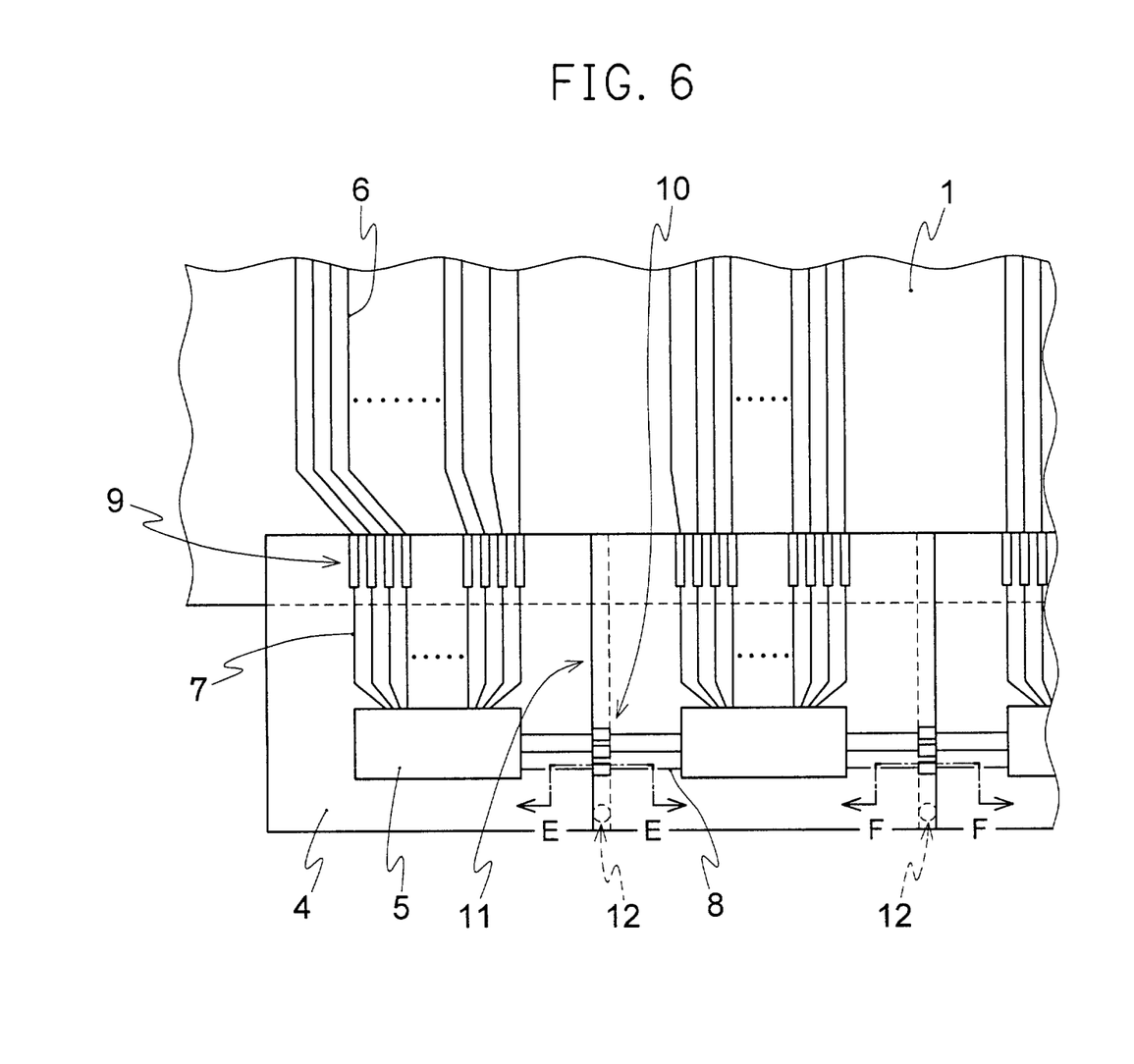
FIG. 6 is a plan view of the mounted portion of the flexible circuit boards in Embodiment 3 of the present invention.
Figure 7A:
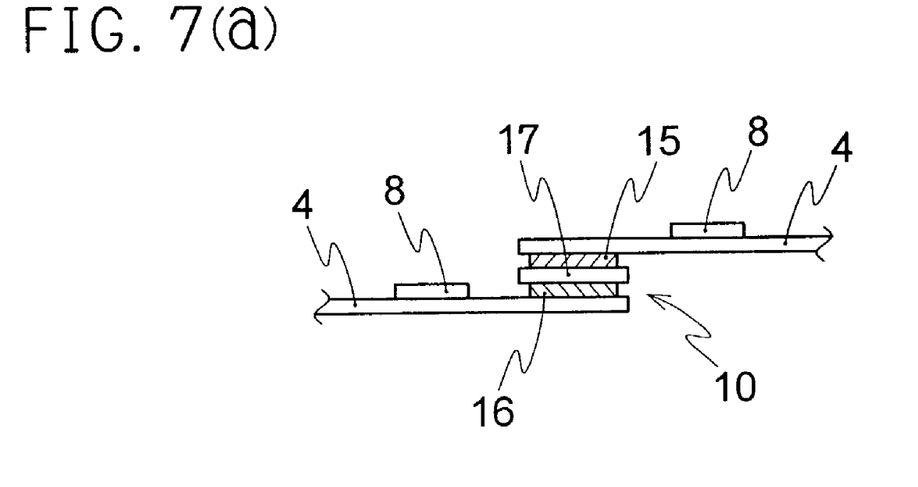
Figure 7B:
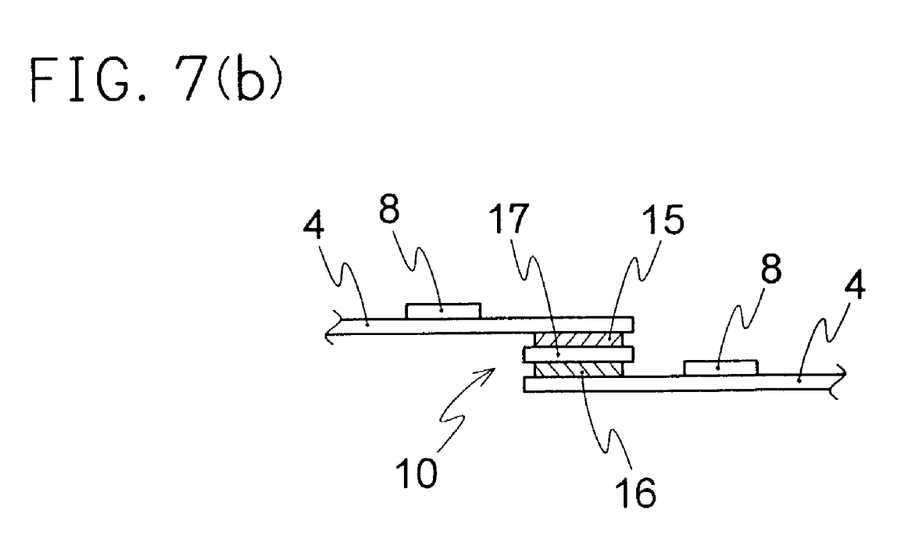

A third embodiment of the present invention will be described hereinafter based on FIGS. 6 and 7. FIG. 6 is a plan view of the mounted portion of the flexible circuit boards 4 in the third embodiment of the present invention, and FIGS. 7(*a*), 7(*b*) are cross sectional views taken along the line E-E and the line F-F of FIG. 6, respectively. In FIGS. 6 and 7, the same components as those in FIGS. 1 to 5 are referred to with the same reference symbols and the following description will be focused on differences between FIGS. 1 to 5 and FIGS. 6 to 7. Although the present embodiment has flexible circuit boards that share overlap regions with adjacent flexible circuit boards 4, it differs from the first embodiment in that the common signal lines 8 for connecting the driver circuits 5 directly connect the common signal lines 8 on the flexible circuit boards in regions which are the overlap regions 11 shared by adjacent flexible circuit boards 4 and which do not overlap with the side of the insulating substrate 1 that has the electrode groups thereon.

The aforementioned structure reveals the same effects as in the first embodiment, and makes it possible to wire the common signal lines 8 for connecting the driver circuits 5 with minimum run lengths, thereby suppressing the occurrence of a wiring delay in the common signal lines. In the present embodiment too, as in the first embodiment, the common signal lines and the driver signal lines on the flexible circuit boards can be formed on either the front side or the rear side of the flexible circuit boards. Also as in the first embodiment, when the flexible circuit boards 4 are folded to the side of the insulating substrate that is opposite to the side having the electrode groups thereon, workability can be improved by applying an adhesive agent onto e.g. the contact regions 12.

EMBODIMENT 4

Figure 8:
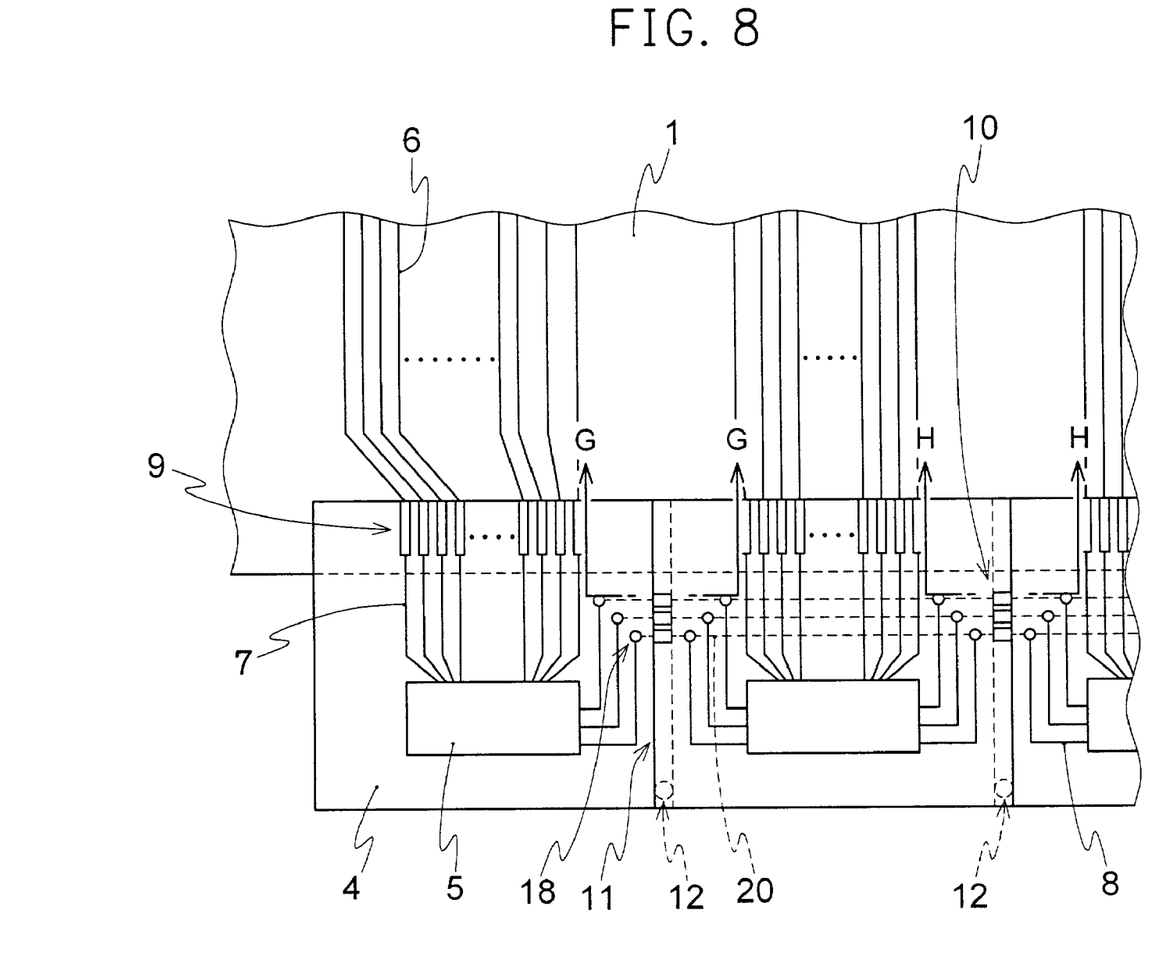
FIG. 8 is a plan view of the mounted portion of the flexible circuit boards in Embodiment 4 of the present invention.
Figure 9A:
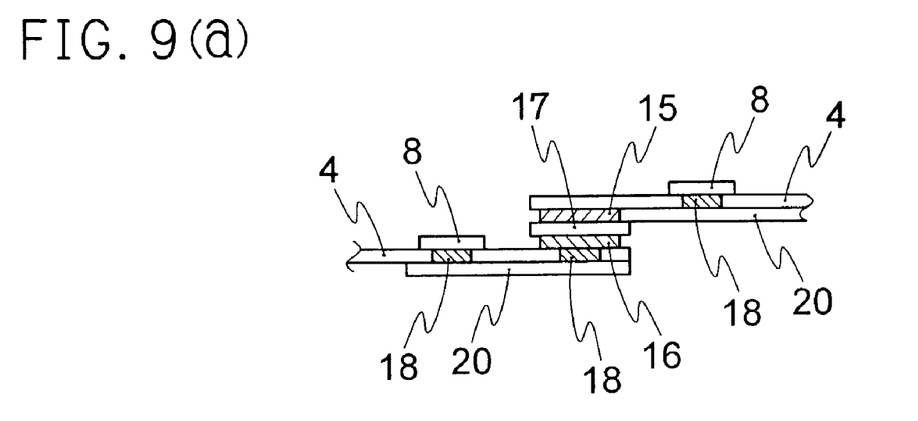
Figure 9B:
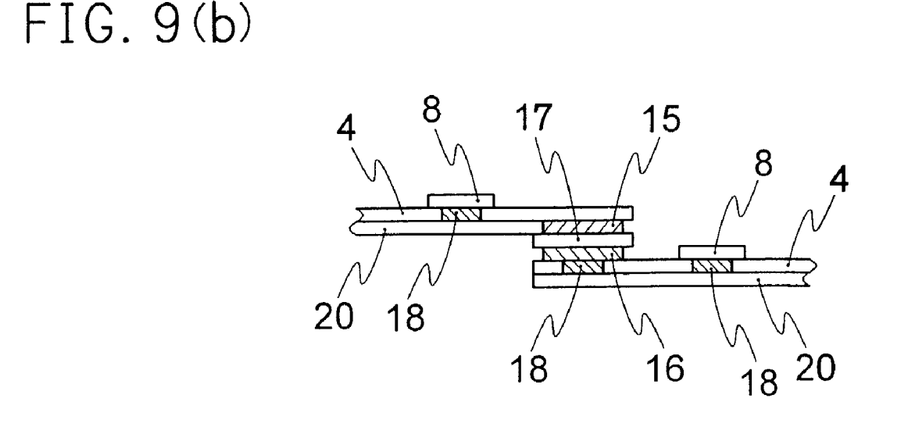

A fourth embodiment of the present invention will be described hereinafter based on FIGS. 8 and 9. FIG. 8 is a plan view of the mounted portion of the flexible circuit boards 4 in the fourth embodiment of the present invention, and FIGS. 9(*a*) and 9(*b*) are cross sectional views taken along the line G-G and the line H-H of FIG. 8, respectively. In FIGS. 8 and 9, the same components as those in FIGS. 1 to 7 are referred to with the same reference symbols and the following description will be focused on differences between FIGS. 1 to 7 and FIGS. 8 to 9. In FIGS. 8 and 9, there are common signal lines 20 which are formed on the side opposite to the driver signal lines 6 on the flexible circuit boards 4 to be entered to the liquid crystal display panel, and through holes 18 which alternately connect the common wirings 8 on the front and rear sides of the flexible circuit boards with the common signal lines 20, and the connection terminals 16 of the common signal lines with the common signal lines 20. In the present embodiment, as in the third embodiment, adjacent flexible circuit boards 4 share overlap regions each other and the common signal lines 8 for connecting the driver circuits 5 are directly connected in regions which are in the overlap regions of adjacent flexible circuit boards and do not overlap with the insulating substrate. On the other hand, the common signal lines 20 on the flexible circuit boards 4 are formed on the side (the rear side in FIGS. 8 and 9) opposite to the side having the driver signal lines 7 to be entered to the liquid crystal display panel, and the common signal lines 20 and the driver signal lines 7 are patterned on both sides in such a manner as to cross each other via the flexible circuit boards 4.

The aforementioned structure reveals the same effects as in the third embodiment and expands the area for the connection terminals 15 and 16 on adjacent flexible circuit boards, thereby further improving the connection reliability. Also as in the first embodiment, when the flexible circuit boards 4 are folded to the side of the insulating substrate that is opposite to the side having the electrode groups thereon, workability can be improved by applying an adhesive agent onto the fixing portions 12 or the like. The present embodiment shows the case where the driver signal lines 7 and the common signal lines 8 are formed on the front side of the flexible circuit boards, whereas the common signal lines 20 crossing the driver signal lines 7 via the flexible circuit boards are formed on the rear side of the flexible circuit boards; however, the opposite case would have the same effects.

EMBODIMENT 5

Figure 10:
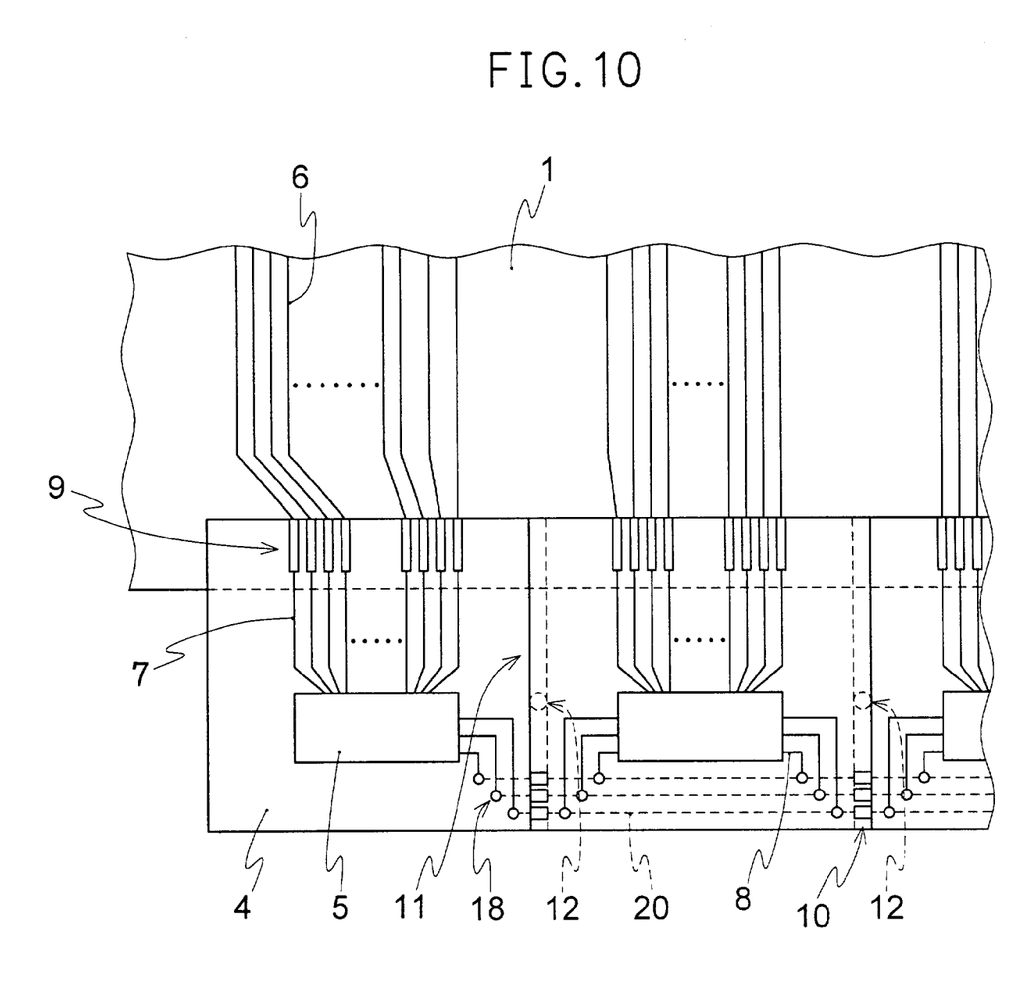
FIG. 10 is a plan view of the mounted portion of the flexible circuit boards in Embodiment 5 of the present invention.

A fifth embodiment of the present invention will be described as follows based on FIG. 10. FIG. 10 is a plan view of the mounted portion of the flexible circuit boards 4 in the fifth embodiment of the present invention. In FIG. 10, the same components as those in FIGS. 1 to 9 are referred to with the same reference symbols and the following description will be focused on differences between FIGS. 1 to 9 and FIG. 10. In the present embodiment, unlike in the fourth embodiment, the common signal lines 20, which are arranged on the side opposite to the side having the input signal lines formed on the flexible circuit boards to be entered to the liquid crystal display panel in the fourth embodiment, are formed on regions the other side of the connection regions between the flexible circuit boards and the insulating substrate when viewed from the driver circuits.

The aforementioned structure reveals the same effects as in the fourth embodiment. In the present embodiment when the flexible circuit boards 4 are folded to the side of the insulating substrate that is opposite to the side having the electrode groups thereon, as shown in FIG. 10 the workability can be improved by setting the contact regions 12 to the vicinity of the center of the overlap regions shared by adjacent flexible circuit boards and applying an adhesive agent thereto. Unlike in the fourth embodiment, the common signal lines 20 on the flexible circuit boards are arranged in positions not crossing the driver signal lines 7 to be entered to the display device, which makes it possible to prevent the occurrence of a short circuit between these wirings. The present embodiment also shows, as in the fourth embodiment, the case where the driver signal lines 7 and the common signal lines 8 are formed on the front side of the flexible circuit boards, whereas the common signal lines 20, which are formed in regions on the other side of the connection regions between the flexible circuit boards and the insulating substrate when viewed from the driver circuits 5, are arranged on the rear side of the flexible circuit boards; however, the opposite case would have the same effects.

The aforementioned first to fifth embodiments have described methods of mounting flexible circuit boards equipped with driver circuits for driving a liquid crystal display device. These embodiments have the same effects when applied to any kind of flexible circuit board containing driver circuits which supply signals to any type of wiring on the insulating substrate, such as scanning lines or image signal lines, which contributes to display.

The first method of mounting flexible circuit boards of the present invention comprises: electrode groups formed on an insulating substrate; terminal groups formed in the vicinity of at least one side of the insulating substrate in such a manner as to be connected to outside at the electrode ends of the electrode groups; and a plurality of flexible circuit boards equipped with driver circuits containing terminals to be connected to the terminal groups and supplying the electrode groups with signals through the terminals, the method comprising the step of mounting the flexible circuit boards on the insulating substrate in a manner that the flexible circuit boards share overlap regions with adjacent flexible circuit boards. This feature can offer a display device with high density packaging.

The second method of mounting flexible circuit boards of the present invention is, in the first method of mounting flexible circuit boards, the step of mounting the flexible circuit boards on the insulating substrate in such a manner that the flexible circuit boards share overlap regions with adjacent flexible circuit boards comprises either the step of first mounting odd-numbered flexible circuit boards when counted from one end of the aligned flexible circuit boards, and then mounting even-numbered flexible circuit boards or the step of first mounting even-numbered flexible circuit boards when counted from one end of the aligned flexible circuit boards, and then mounting odd-numbered flexible circuit boards. This feature can offer a display device capable of facilitating the operation to replace a defective flexible circuit board with a good one.

The third method of mounting flexible circuit boards of the present invention is characterized that, in the first or second method of mounting flexible circuit boards, the flexible circuit boards further include driver signal lines which are outputted from the driver circuits and are connected to the electrode groups on the insulating substrate, and common signal lines which are connected between the flexible circuit boards, the method further comprising the step of connecting the common signal lines between adjacent flexible circuit boards through conductive patterns on the flexible circuit boards. This feature can offer a display device with high connection reliability.

The fourth method of mounting flexible circuit boards of the present invention is characterized that, in the third method of mounting flexible circuit boards, the step of mounting the flexible circuit boards on the insulating substrate in such a manner that the flexible circuit boards share overlap regions with adjacent flexible circuit boards further comprises the step of connecting the common signal lines in regions where adjacent flexible circuit boards overlap each other and which also overlap with the surface of the insulating substrate that has the electrode groups thereon. This feature can offer a display device with higher connection reliability.

The fifth method of mounting flexible circuit boards of the present invention comprises: electrode groups formed on an insulating substrate; terminal groups formed in the vicinity of at least one side of the insulating substrate in such a manner as to be connected to outside at the electrode ends of the electrode groups; and a plurality of flexible circuit boards equipped with driver circuits containing terminals to be connected to the terminal groups and supplying the electrode groups with signals through the terminals and also equipped with common signal lines which are commonly connected to the driver circuits and driver signal lines which are outputted from the driver circuits and are connected to the electrode groups on the insulating substrate, the method comprising the step of mounting the flexible circuit boards on the insulating substrate in such a manner as to be arranged close to adjacent flexible circuit boards; the step of forming connection terminals in regions of the insulating substrate that overlap with the vicinity of gaps between adjacent flexible circuit boards; and the step of connecting the common signal lines on the flexible circuit boards via the connection terminals. This feature can offer a display device with high connection reliability and high density packaging.

The first display device of the present invention comprises: electrode groups formed on an insulating substrate; terminal groups formed in the vicinity of at least one side of the insulating substrate in such a manner as to be connected to outside at the electrode ends of the electrode groups; and a plurality of flexible circuit boards equipped with driver circuits containing terminals to be connected to the terminal groups and supplying the electrode groups with signals through the terminals, the flexible circuit boards being mounted on the insulating substrate, the display device being characterized in that the flexible circuit boards share overlap regions with adjacent flexible circuit boards. This feature can achieve high density packaging.

The second display device of the present invention is characterized in that, in the first display device, the overlap regions of adjacent flexible circuit boards are formed by mounting the flexible circuit boards either in a manner that even-numbered flexible circuit boards when counted from one end of the aligned flexible circuit boards are partly overlaid on odd-numbered flexible circuit boards, or in such a manner that odd-numbered flexible circuit boards when counted from one end of the aligned flexible circuit boards are partly overlaid on even-numbered flexible circuit boards. This feature can facilitate the operation to replace a defective flexible circuit board with a good one.

The third display device of the present invention is characterized in that, in the first or second display device, the flexible circuit boards further comprise driver signal lines which are outputted from the driver circuits and are connected to the electrode groups on the insulating substrate and common signal lines which are connected between the flexible circuit boards, and that the common signal lines are connected between adjacent flexible circuit boards through conductive patterns on the flexible patterns. This feature can improve connection reliability.

The fourth display device of the present invention is characterized in that, in the third display device, the common signal lines, which are directly connected between adjacent flexible circuit boards by the conductive patterns on the flexible circuit boards, are connected in regions which are the overlap regions shared by adjacent flexible circuit boards and which also overlap with the surface of the insulating substrate that has the electrode groups thereon. This feature can further improve connection reliability.

The fifth display device of the present invention comprises electrode groups formed on an insulating substrate; terminal groups formed in the vicinity of at least one side of the insulating substrate in such a manner as to be connected to outside at the electrode ends of the electrode groups; and a plurality of flexible circuit boards equipped with driver circuits containing terminals to be connected to the terminal groups and supplying the electrode groups with signals through the terminals and also equipped with common signal lines which are commonly connected between adjacent flexible circuit boards and driver signal lines which are outputted from the driver circuits and are connected to the electrode groups on the insulating substrate, the flexible circuit boards being mounted on the insulating substrate, the display device being characterized in that the flexible circuit boards are mounted on the insulating substrate in such a manner as to be arranged close to adjacent flexible circuit boards, and that the common signal lines on the flexible circuit boards are connected via connection terminals formed in the vicinity of gaps between adjacent flexible circuit boards and on the insulating substrate. This feature can improve connection reliability and achieve high density packaging.

What is claimed is:

1. Method of mounting flexible circuit boards including: electrode groups formed on an insulating substrate; terminal groups formed in the vicinity of at least one side of the insulating substrate in such a manner as to be connected to outside at the electrode ends of the electrode groups; and terminals to be connected to the terminal groups; and a plurality of flexible circuit boards equipped with driver circuits inputting signals to the electrode groups via the terminals, wherein said method includes the step of mounting the flexible circuit boards on the insulating substrate in such a manner that the flexible circuit boards share overlap regions and have physical contacts in said overlap regions with adjacent flexible circuit boards, wherein said step includes either the step of first mounting odd-numbered flexible circuit boards when counted from one end of the aligned flexible circuit boards, and then mounting even-numbered flexible circuit boards or the step of first mounting even-numbered flexible circuit boards when counted from one end of the aligned flexible circuit boards, and then mounting odd-numbered flexible circuit boards.

2. Method of mounting flexible circuit boards including: electrode groups formed on an insulating substrate; terminal groups formed in the vicinity of at least one side of the insulating substrate in such a manner as to be connected to outside at the electrode ends of the electrode groups; and terminals to be connected to the terminal groups; and a plurality of flexible circuit boards equipped with driver circuits inputting signals to the electrode groups via the terminals, wherein said method includes the step of mounting the flexible circuit boards on the insulating substrate in such a manner that the flexible circuit boards share overlap regions and have physical contacts in said overlap regions with adjacent flexible circuit boards, wherein said flexible circuit boards further include driver signal lines which are outputted from the driver circuits and are connected to the electrode groups on the insulating substrate, and common signal lines which are connected between the flexible circuit boards, wherein said method further includes the step of connecting the common signal lines between adjacent flexible circuit boards through conductive patterns on the flexible circuit boards.

3. Method of mounting flexible circuit boards including: electrode groups formed on an insulating substrate; terminal groups formed in the vicinity of at least one side of the insulating substrate in such a manner as to be connected to outside at the electrode ends of the electrode groups; and terminals to be connected to the terminal groups; and a plurality of flexible circuit boards equipped with driver circuits inputting signals to the electrode groups via the terminals, wherein said method includes the step of mounting the flexible circuit boards on the insulating substrate in such a manner that the flexible circuit boards share overlap regions and have physical contacts in said overlap regions with adjacent flexible circuit boards, wherein said step further includes the step of connecting the common signal lines in regions where adjacent flexible circuit boards overlap each other and which also overlap with the surface of the insulating substrate that has the electrode groups thereon.

4. A display device comprising:

electrode groups formed on an insulating substrate, terminal groups formed in the vicinity of at least one side of the insulating substrate in such a manner as to be connected to outside at the electrode ends of the electrode groups, driver circuits for inputting the signals to the electrode groups via terminals to be connected to the terminal groups and the terminals, and a plurality of flexible circuit boards mounted on the insulating substrate, wherein said flexible circuit boards share overlap regions and have physical contacts in said overlap regions with adjacent flexible circuit boards, wherein said overlap regions of adjacent flexible circuit boards are formed by mounting the flexible circuit boards either in such a manner that even-numbered flexible circuit boards when counted from one end of the aligned flexible circuit boards are partly overlaid on odd-numbered flexible circuit boards, or in such a manner that odd-numbered flexible circuit boards when counted from one end of the aligned flexible circuit boards are partly overlaid on even-numbered flexible circuit boards.

5. A display device comprising:

electrode groups formed on an insulating substrate, terminal groups formed in the vicinity of at least one side of the insulating substrate in such a manner as to be connected to outside at the electrode ends of the electrode groups, driver circuits for inputting the signals to the electrode groups via terminals to be connected to the terminal groups and the terminals, and a plurality of flexible circuit boards mounted on the insulating substrate, wherein said flexible circuit boards share overlap regions and have physical contacts in said overlap regions with adjacent flexible circuit boards, wherein said flexible circuit boards further include driver signal lines which are coupled to outputs from the driver circuits and are connected to the electrode groups on the insulating substrate and common signal lines which are connected between the flexible circuit boards, and that the common signal lines are connected between adjacent flexible circuit boards through conductive patterns on the flexible circuit boards.

6. A display device comprising:

electrode groups formed on an insulating substrate, terminal groups formed in the vicinity of at least one side of the insulating substrate in such a manner as to be connected to outside at the electrode ends of the electrode groups, driver circuits for inputting the signals to the electrode groups via terminals to be connected to the terminal groups and the terminals, and a plurality of flexible circuit boards mounted on the insulating substrate, wherein said flexible circuit boards share overlap regions and have physical contacts in said overlap regions with adjacent flexible circuit boards, wherein said common signal lines, which are connected between adjacent flexible circuit boards by the conductive patterns on the flexible circuit boards, are connected in regions which are the overlap regions shared by adjacent flexible circuit boards and which also overlap with the surface of the insulating substrate that has the electrode groups thereon.

* * * * *